United States Patent
Ishihara

[11] Patent Number: 5,880,613
[45] Date of Patent: Mar. 9, 1999

[54] LOGIC STORING CIRCUIT AND LOGIC CIRCUIT

[75] Inventor: Fujio Ishihara, Tokyo, Japan

[73] Assignee: Kabushiki Kaisha Toshiba, Kawasaki, Japan

[21] Appl. No.: 925,046

[22] Filed: Sep. 8, 1997

[30] Foreign Application Priority Data

Oct. 11, 1996 [JP] Japan .................................. 8-270108

[51] Int. Cl.⁶ ........................ H03K 3/289; H03K 3/356
[52] U.S. Cl. ........................ 327/202; 327/203; 327/208; 327/211
[58] Field of Search ............................. 327/91, 199, 208, 327/202, 203, 211, 200, 201, 212, 214, 225

[56] References Cited

U.S. PATENT DOCUMENTS

| | | | |
|---|---|---|---|
| 4,495,629 | 1/1985 | Zasio et al. ............................. | 327/202 |
| 4,506,167 | 3/1985 | Little et al. ............................ | 327/211 |
| 4,629,909 | 12/1986 | Cameron ............................... | 327/211 |
| 5,025,174 | 6/1991 | Shikata ................................. | 327/203 |
| 5,081,373 | 1/1992 | Suzuki ................................. | 327/94 |

Primary Examiner—Timothy P. Callahan
Assistant Examiner—An T. Luu
Attorney, Agent, or Firm—Foley & Lardner

[57] ABSTRACT

A master portion may introduce input data thereinto in a low level period of a clock and then hold and output the input data therefrom in a high level period of the clock. A slave portion may introduce input data thereinto in the high level period of the clock and then hold and output the input data therefrom in the low level period of the clock. Two exclusive NOR circuits may compare present logic values of the input data with logic values in a preceding half period of the clock to determine coincidences therebetween respectively, and then control output states of the input data held in the master portion and the slave portion based on results of their comparisons.

6 Claims, 10 Drawing Sheets

LOGIC STORING CIRCUIT AND LOGIC CIRCUIT

BACKGROUND OF THE INVENTION

1. Field of the Invention

The present invention relates to a logic storing circuit composed of an edge-triggered-latch capable of latching input data when it is triggered by edges of a driving clock, and a logic circuit including means for supplying the driving clock to the logic storing circuit.

2. Description of the Prior Art

In the prior art, as the edge-triggered-latch (abbreviated as an "FF" (Flip-Flop) hereinafter) of this type, two kinds of circuits have been known commonly, i.e., one is such a circuit that data can be latched when the circuit is triggered by only one of leading and trailing edges of the clock (referred to as a "single FF circuit" hereinafter) and the other is such a circuit that data can be latched when the circuit is triggered by both the leading and trailing edges of the clock (referred to as a "double FF circuit" hereinafter).

As shown in FIG. 1, the single FF circuit, which is indispensable for constituting a sequential logic circuit, is composed of a master latch portion 101 which is turned into a through state in an "L" level phase of a clock CK and a slave latch portion 102 which is turned into the through state in an "H" level phase of the clock CK, both being connected in series with each other. More particularly, the master latch portion 101 is made up of a transfer gate 103 which may transfer input data IN in the "L" level phase (Ma in FIG. 2) of the clock CK, and a latch 104 which consists of two inverters 104a, 104b. Similarly, the slave latch portion 102 is made up of a transfer gate 105 which may transfer an output of the latch 104 in the "H" level phase (Sa in FIG. 2) of the clock CK, and a latch 106 which consists of two inverters 106a, 106b.

In the single FF circuit constituted as above, as illustrated in a timing chart in FIG. 2, input data IN are latched and output data OUT are output when the single FF circuit is triggered only by such edges that the clock CK rises up from the "L" level to the "H" level, i.e., leading edges of the clock CK. The input data IN are not latched when the single FF circuit is triggered by such edges that the clock CK falls down from the "H" level to the "L" level.

FIG. 3 is a schematic circuit diagram showing a configuration of a clock tree portion for driving the single FF circuit shown in FIG. 1.

The clock tree portion consists of a PLL (Phase Locked Loop) circuit 201 for generating an LSI internal clock (oscillation frequency f) to synchronize with an external clock CLK, and a clock buffer circuit 202 for driving the internal clock output from the PLL circuit 201. An output CK of the clock buffer circuit 202 is fed back to an input side of the PLL circuit 201 as a reference clock. This feed-back is to adjust the internal clock CK output from the clock buffer circuit 202 in phase so as to achieve coincidence of respective leading edges of the external clock CLK and the internal clock CK.

At the same time when the internal clock CK which is output from the clock buffer circuit 202 is supplied to the single FF circuit 301 via a signal line 203, an inverted signal CKB of the internal clock CK is also supplied to the single FF circuit 301 via an inverter 204.

In this manner, in the single FF circuit constructed as above, because of the circuit configuration, data can be latched only when the single FF circuit is triggered by one of edges of the clock. Hence, if the single FF circuit is applied to the high speed logic circuit, a frequency of the supplied clock has to be set higher. As a result, power consumption caused by switching operations in the clock tree portion would be increased. In addition, the single FF circuit is subjected conspicuously to the influence of parasitic inductance component when the high frequency clock is transferred therethrough. Hence, in order to adjust skew between local clocks distributed in respective regions of the chip and to suppress "rounding" of waveform of the clock, there is necessity of improvements in circuit design.

In order to overcome the problems of the supplied clock in the above single FF circuit, a double FF circuit shown in FIG. 4 has already been proposed wherein data can be latched to synchronize with both the leading and trailing edges of the clock.

In this double FF circuit, circuits in which output transfer gates 405, 408 are provided respectively to output stages of the master and slave latches 401, 402 are connected in parallel between clocks CK2 whose frequency is ½ of clock CK. The output transfer gates 405, 408 are opened and closed in an opposite phase of the clock to input transfer gates 403, 406. In FIG. 4, a reference 401 denotes a master latch portion; 402, a slave latch portion; 403, an input transfer gate of the master latch portion 401; 404, a latch circuit of the master latch portion 401; 405, an output transfer gate of the master latch portion 401; 406, an input transfer gate of the slave latch portion 402; 407, a latch circuit of the slave latch portion 402; and 408, an output transfer gate of the slave latch portion 402.

As would be evident from a timing chart illustrated in FIG. 5, in the double FF circuit having the above configuration, input data IN can be latched and output data OUT can be output when the double FF circuit is triggered by both the leading and trailing edges of the clock CK2.

FIG. 6 is a schematic circuit diagram showing a configuration of a clock tree portion for driving the double FF circuit shown in FIG. 4.

In the clock tree portion in FIG. 6, a PLL circuit 501 having a ½ oscillation frequency and a clock buffer circuit 502 having a twice driving force are provided in place of the PLL circuit 201 and the clock buffer circuit 202 in the configuration shown in FIG. 3. The internal clock CK2 output from the clock buffer circuit 502 is supplied to the double FF circuit 601 via a signal line 503 and at the same time an inverted signal CK2B of the internal clock CK2 is supplied to the double FF circuit 601 via an inverter 504.

With the above configuration, even if the clock CK2 having a frequency which is half of the clock CK being supplied to the single FF circuit is employed, the double FF circuit becomes equivalent in circuit function to the single FF circuit. Not only the influence of parasitic inductance component can be lessened because of reduction by half in the clock frequency to thus improve skew between the local clocks and "rounding" of the clock waveform, but also the switching frequency per unit time in the clock tree portion can be reduced to half in contrast to the single FF circuit. Therefore, reduction in power consumption can be expected by the above double FF circuit.

In the meanwhile, the single FF circuit and the double FF circuit as described above have been constructed to hold statically the logic value between the input and output transfer gates. On the contrary, a double FF circuit composed of a so-called dynamic latch has been known in the art (see Patent Application Publication Laid-open No. 6-237152).

FIG. 7 is a circuit diagram showing another double FF circuit disclosed in the above Patent Application Publication in the prior art.

In this double FF circuit in FIG. 7, data of the master and slave latches can be held dynamically as charges accumulated respectively on nodes between clocked inverters 701, 702 and between clocked inverters 801,802. Taking account of the fact that to introduce newly the input logical value into either the master latch or the slave latch is not needed in the case that the input logical value and the output logical value are equal to each other, a new logical value can be latched by supplying a clock signal φ to the input side clocked inverters 701, 801 with the use of a circuit consisting of an EX-OR gate 901, an AND gate 902, and an OR gate 903 only in the case that the input logical value and the output logical value are not equal to each other.

However, in the double FF circuit shown in FIG. 4, the circuits provided on the output stages of the master and slave latches 401, 402 which are connected in parallel with each other are composed of the transfer gates 405, 408 which are controlled by the clock CK2. For this reason, gate capacitance load connected to the clock nodes becomes doubled in comparison with the single FF circuit shown in FIG. 1. Accordingly, an advantage of reducing power consumption in the clock tree portion due to reduction in the clock frequency mentioned above has been canceled.

Then, in the double FF circuit disclosed in the Patent Application Publication and shown in FIG. 7, the clock signal φ used to control the overall circuit is supplied via the AND gate 902 and the OR gate 903 to the upper and lower clocked inverters 701, 801 which are provided in the vicinity of the input D, nevertheless the clock signal φ is supplied directly to the upper and lower clocked inverters 702, 802 which are provided in the vicinity of the output Q. In other words, as in the double FF circuit shown in FIG. 4, the number of logical devices connected to the clock nodes is four and therefore, like the above, the advantage of reducing power consumption in the clock tree portion has been canceled.

SUMMARY OF THE INVENTION

The present invention has been made to overcome the above-mentioned problems in the prior art, and it is an object of the present invention to provide a logic storing circuit which is able to suppress the magnitude of gate capacitance load connected to clock nodes to the same extent as a single FF circuit, so that power consumption in a clock tree portion can be reduced to half as compared with the case where the single FF circuit is employed.

It is another object of the present invention to provide a logic circuit which is equipped with the logic storing circuit to suppress power consumption and improve skew between local clock signals and "rounding" of waveform of the clock signal.

In order to achieve the above objects, according to an aspect of the present invention, there is provided a logic storing circuit comprising: first data holding means for introducing input data thereinto in a low level period of a clock, and holding and outputting the input data therefrom in a high level period of the clock; second data holding means for introducing the input data thereinto in the high level period of the clock, and holding and outputting the input data therefrom in the low level period of the clock; and a comparing/controlling section for comparing a present logic value of the input data with a logic value in a preceding half period of the clock to determine a coincidence therebetween, and then controlling output states of the input data held in the first data holding means and the second data holding means based on a result of its comparison.

In the present invention, the comparing/controlling section compares a present logic value of the input data with a logic value in a preceding half period of the clock to determine a coincidence therebetween, and then controls output states of the data held in the first data holding means and the second data holding means on the basis of the result of its comparison, i.e., its coincidence or inconsistency.

According to another aspect of the present invention, there is provided a logic storing circuit comprising: first data introducing means for introducing input data thereinto in a low level period of a clock; first latch means for holding data output from the first data introducing means; first data outputting means for outputting data held in the first latch means to an outside in a high level period of the clock; second data introducing means for introducing the input data thereinto in the high level period of the clock; second latch means for holding data output from the second data introducing means; second data outputting means for outputting data held in the second latch means to the outside in the low level period of the clock; a first comparing/controlling section for comparing the data held in the second latch means with the input data to determine a coincidence therebetween, and then controlling output states of the first data outputting means based on a result of its comparison; and a second comparing/controlling section for comparing the data held in the first latch means with the input data to determine a coincidence therebetween, and then controlling output states of the second data outputting means based on a result of its comparison.

In the present invention, the result of coincidence comparison between the input data and the data held in the second latch means is employed as the signal which turns the first data outputting means into its "transfer state". Similarly, the result of coincidence comparison between the input data and the data held in the first latch means is employed as the signal which turns the second data outputting means into its "transfer state".

In the preferred embodiment of the present invention, any or all of the first data introducing means, the second data introducing means, the first data outputting means, and the second data outputting means are made up of a transfer gate.

Therefore, configurations of the first and second data introducing means and the first and second data outputting means can be simplified.

In the preferred embodiment of the present invention, any or all of the first data introducing means, the second data introducing means, the first data outputting means, and the second data outputting means are made up of a tri-state buffer.

Therefore, the circuit of the second aspect of the present invention can be operated simply and precisely.

According to still another aspect of the present invention, there is provided a logic storing circuit comprising: first data introducing means for introducing input data thereinto in a low level period of a clock; first data outputting means for outputting data introduced in the first data introducing means to an outside in a high level period of the clock; second data introducing means for introducing the input data thereinto in the high level period of the clock; second data outputting means for outputting data introduced in the second data introducing means to the outside in the low level period of the clock; a first comparing/controlling section for comparing the data held in the second data introducing means at a certain time point with the input data to determine a coincidence therebetween, and then controlling output states of the first data outputting means based on a result of its comparison; and a second comparing/controlling section for comparing the data held in the first data introducing means at a certain time point with the input data to determine a coincidence therebetween, and then controlling output states of the second data outputting means based on a result of its comparison.

In the present invention, the input data can be held dynamically in the form of charges accumulated on the nodes between the first data introducing means and the first data outputting means and between the second data introducing means and the second data outputting means.

According to yet still another aspect of the present invention, there is provided a logic circuit comprising: a logic storing circuit including first data holding means for introducing input data thereinto in a low level period of a clock, and holding and outputting the input data therefrom in a high level period of the clock, second data holding means for introducing the input data thereinto in the high level period of the clock, and holding and outputting the input data therefrom in the low level period of the clock, and a comparing/controlling section for comparing a present logic value of the input data with preceding logic values to determine a coincidence therebetween, and then controlling output states of the input data held in the first data holding means and the second data holding means based on a result of its comparison; and clock supplying means for supplying the clock to the logic storing circuit.

In the present invention, the logic circuit can present similar operations to those of the above aspect of the invention, and in addition the magnitude of gate capacitance load connected to the clock supplying means can be suppressed to the same level as the single FF circuit, and therefore power consumption in the clock supplying means can be reduced to half as compared with the case where the single FF circuit is employed.

The nature, principle and utility of the invention will become more apparent from the following detailed description when read in conjunction with the accompanying drawings.

DESCRIPTION OF THE PREFERRED EMBODIMENTS

Embodiments of the present invention will be explained with reference to accompanying drawings hereinafter.

Figure 8:
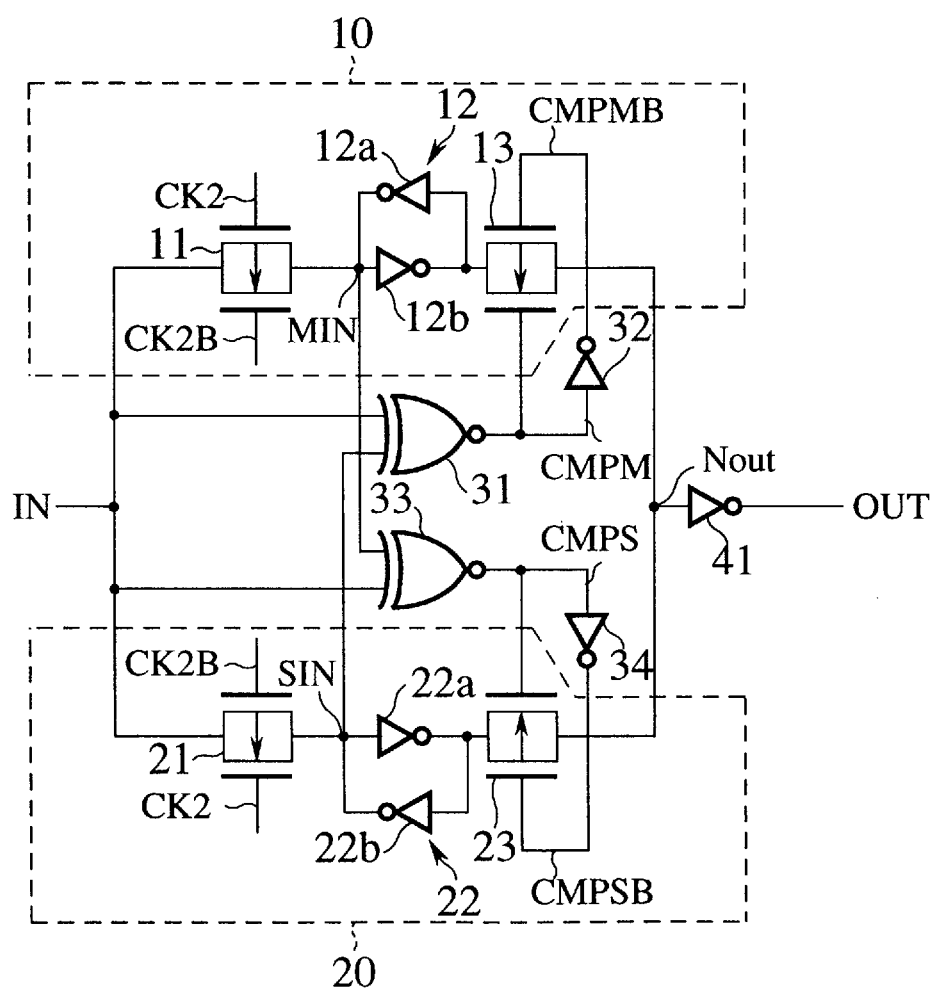
FIG. 8 is a circuit diagram showing a double FF circuit as a logic storing circuit according to a first embodiment of the present invention.

FIG. 8 is a circuit diagram showing a double FF circuit as a logic storing circuit according to a first embodiment of the present invention.

Prior to detailed explanation of the first embodiment, a basic principle of the present invention will be at first explained.

Figure 9B:
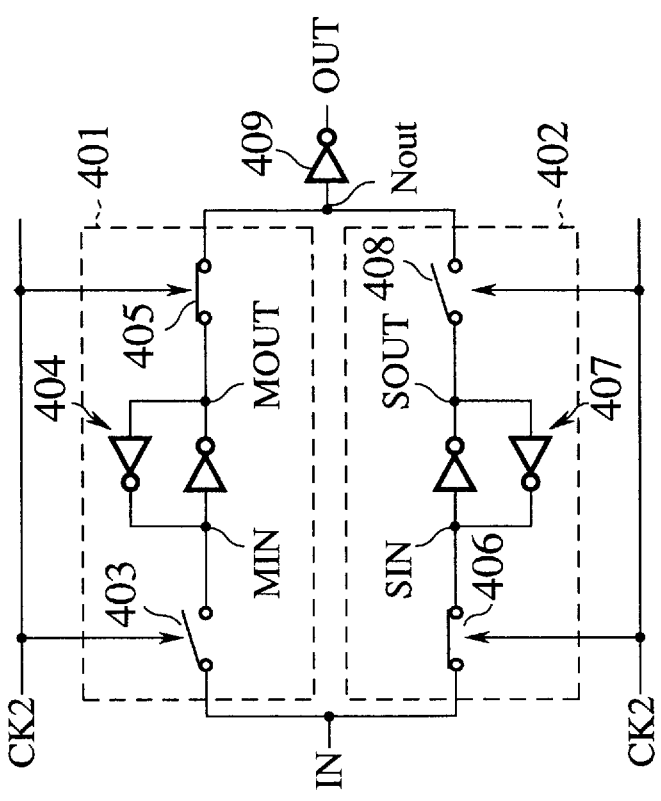
FIGS. 9A and 9B are schematic view showing operations of the double FF circuit in the prior art to illustrate a basic principle of the present invention.
Figure 9A:
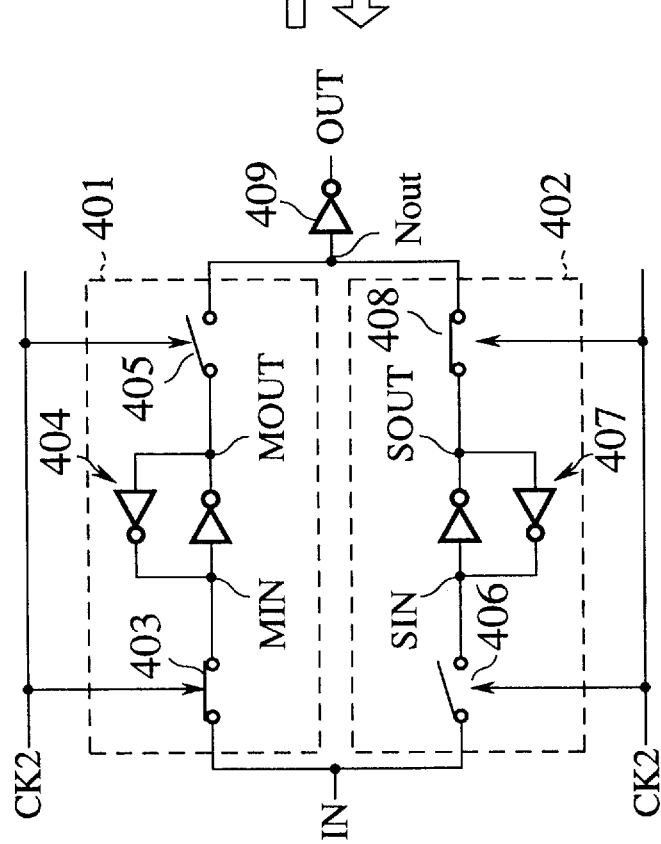

FIGS. 9A and 9B are schematic view showing operations of the double FF circuit in the prior art to illustrate the basic principle of the present invention. FIGS. 9A and 9B show schematically operations of the double FF circuit shown in FIG. 4 by replacing the transfer gates with switches 403, 405, 406, 408 which are driven by the clock CK2. FIG. 9A shows a situation that, when the clock CK2 is at "L" level, the latch 404 in the master portion 401 latches input data IN and the latch 407 in the slave portion 402 outputs data held therein in the preceding half cycle. FIG. 9B shows a situation that, when the clock CK2 is at "H" level, the latch 407 in the slave portion 402 latches input data IN and the latch 404 in the master portion 401 outputs data held therein in the preceding half cycle.

In the double FF circuit, as shown in FIG. 9A, if the clock CK2 is at "L" level, the latch 404 in the master portion 401 is shifted to its through state to introduce the input data IN therein whereas the latch 407 in the slave portion 402 is shifted to its hold state to hold and output the input data IN introduced thereinto in the preceding half cycle. Conversely, as shown in FIG. 9B, if the clock CK2 is at "H" level, the latch 407 in the slave portion 402 introduces the input data IN therein whereas the latch 404 in the master portion 401 holds and outputs the input data IN introduced thereinto in the preceding half cycle.

Let consider now a role of the transfer gate 405 provided on the output stage of the master portion 401 shown in FIGS. 9A and 9B. In a clock phase shown in FIG. 9A, this transfer gate 405 is in an "open state" to separate an output MOUT from an output node Nout. This is because a collision between the output MOUT output from the latch 404 in the master portion 401, which latches the input data IN, and an output SOUT output from the latch 407 in the slave portion 402, which outputs data SIN held in the preceding half cycle, should be prevented. From the opposite viewpoint, in case the input data IN always coincides logically with the data SIN, there is no discrepancy in the logical value to be output to the output node Nout even if the transfer gate 405 is shifted to its through state.

On the contrary, in an opposite clock phase shown in FIG. 9B, this transfer gate 405 is in a "closed state" since the output MOUT which corresponds to the data MIN latched in the preceding half cycle is to be output from the latch 404 to the output node Nout. At this time, the input transfer gate 406 is in a "closed state" since the latch 407 in the slave portion 402 latches the input data IN. Hence, a logical value of the input data IN coincides with a logical value of the data SIN.

If two situations mentioned above are considered together, it can be concluded that the output side transfer gate 405 may be set in the "closed state" in case the input data IN and the data SIN are the same logical data. Because the double FF circuit is constructed symmetrically with respect to the master and slave portions, this concept is similarly true of the transfer gate 408. Therefore, the transfer gate 408 may also assume its "closed state" in case the input data IN and the data MIN are the same logical data.

The double FF circuit according to the first embodiment of the present invention is constructed based on such concept discussed above. A configuration and an operation of the double FF circuit will be explained in detail hereunder.

Figure 4:
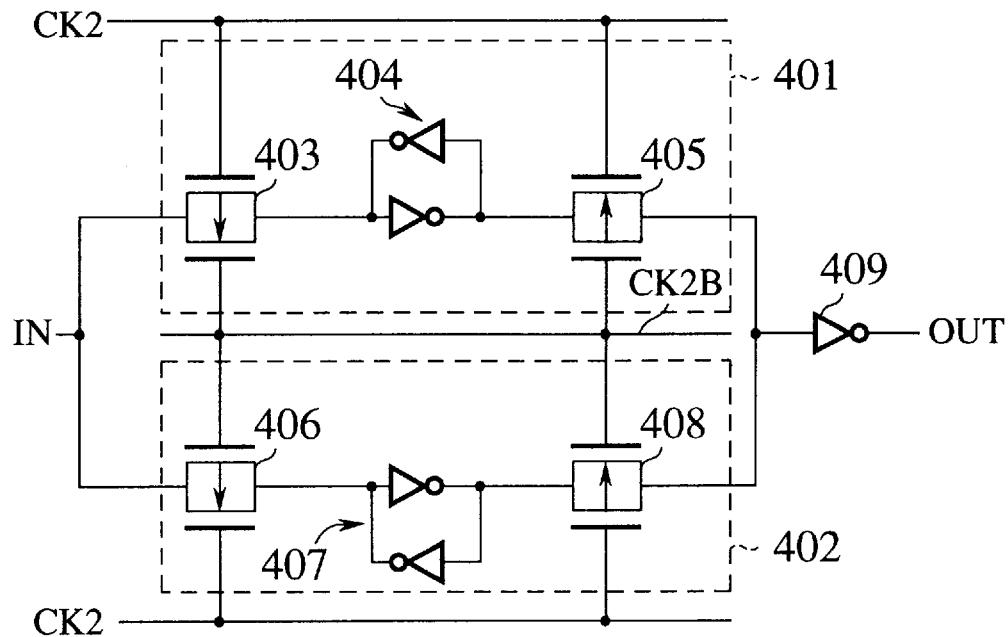
FIG. 4 is a circuit diagram showing a double FF circuit in the prior art.
Figure 5:
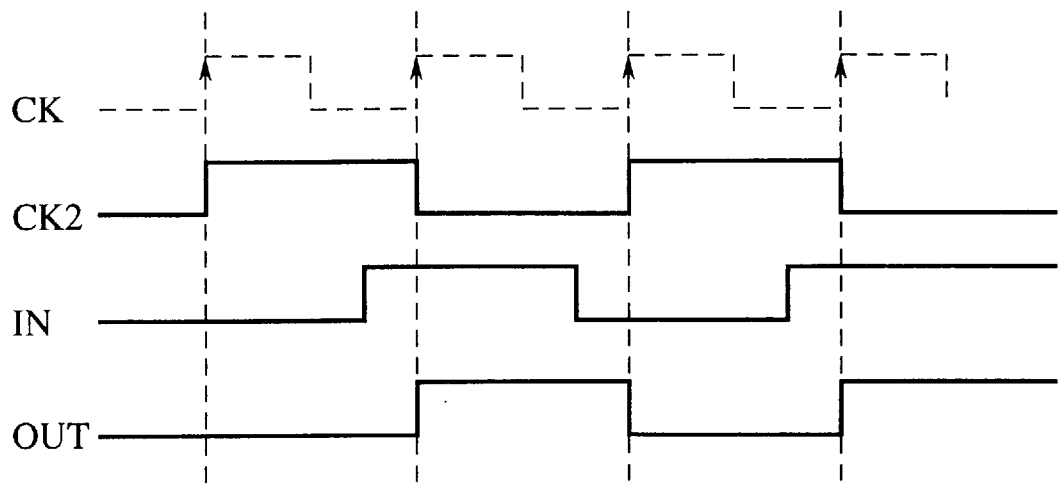
FIG. 5 is a timing chart illustrating an operation of the double FF circuit shown in FIG. 4.

A key feature of the double FF circuit according to the first embodiment in structure is that, as shown in FIG. 8, output transfer gates which are driven mutually in accordance with exclusive NOR of the input data IN and the data held in the latches on the counter side are provided on respective output stages of the latches of the master and slave portions, both being driven by the clock CK2 used in FIG. 4, and the master portion and the slave portion having such output transfer gates are connected in parallel.

More particularly, a master portion 10 and a slave portion 20 are constructed respectively by connecting input transfer gates 11, 21, latch circuits 12, 22, and output transfer gates 13, 23 in sequence. The input transfer gates 11, 21 of the master portion 10 and the slave portion 20 are driven and controlled by the clock CK2 and inverted clock CK2B. The input transfer gate 11 of the master portion 10 is turned ON (transfer state) in an "L" level period of the clock CK2 to introduce the input data IN into the latch circuit 12. The input transfer gate 21 of the slave portion 20 is turned ON in an "H" level period of the clock CK2 to introduce the input data IN into the latch circuit 22.

In addition, the latch circuits 12, 22 are composed of two inverse-parallel connected inverters 12a, 12b and 22a, 22b respectively. The feed-back inverters 12a, 22b are set respectively to have a small driving force rather than the inverters 12b, 22a. The output transfer gates 13, 23 are driven and controlled by output of comparing portions described later. The output transfer gate 13 of the master portion 10 is not driven by the clock signal, but can output the data held in the latch 12 in the "H" level period of the clock CK2 on the basis of an operation of an exclusive NOR circuit 31. The output transfer gate 23 of the slave portion 20 can output the data held in the latch 22 in the "L" level period of the clock CK2 on the basis of an operation of an exclusive NOR circuit 33.

Meanwhile, the exclusive NOR circuit (EX-NOR circuit) 31 which compares the data SIN held in the latch 22 of the slave portion 20 with the input data IN to determine a coincidence between them is provided to the double FF circuit. An output CMPM output from the exclusive NOR circuit 31 and an inverted signal CMPMB of the output CMPM output via an inverter 32 are supplied to control terminals of the output transfer gate 13 of the master portion 10. Furthermore, the exclusive NOR circuit 33 which compares the data MIN held in the latch 12 of the master portion 10 with the input data IN to determine a coincidence between them is provided to the double FF circuit. An output CMPS output from the exclusive NOR circuit 33 and an inverted signal CMPSB of the output CMPS output via an inverter 34 are supplied to control terminals of the output transfer gate 23 of the slave portion 20.

Output terminals of the output transfer gates 13, 23 of the master and slave portions 10, 20 are connected commonly to the output node Nout. Output data OUT can then be output from the output node Nout via an inverter 41.

Figure 10:
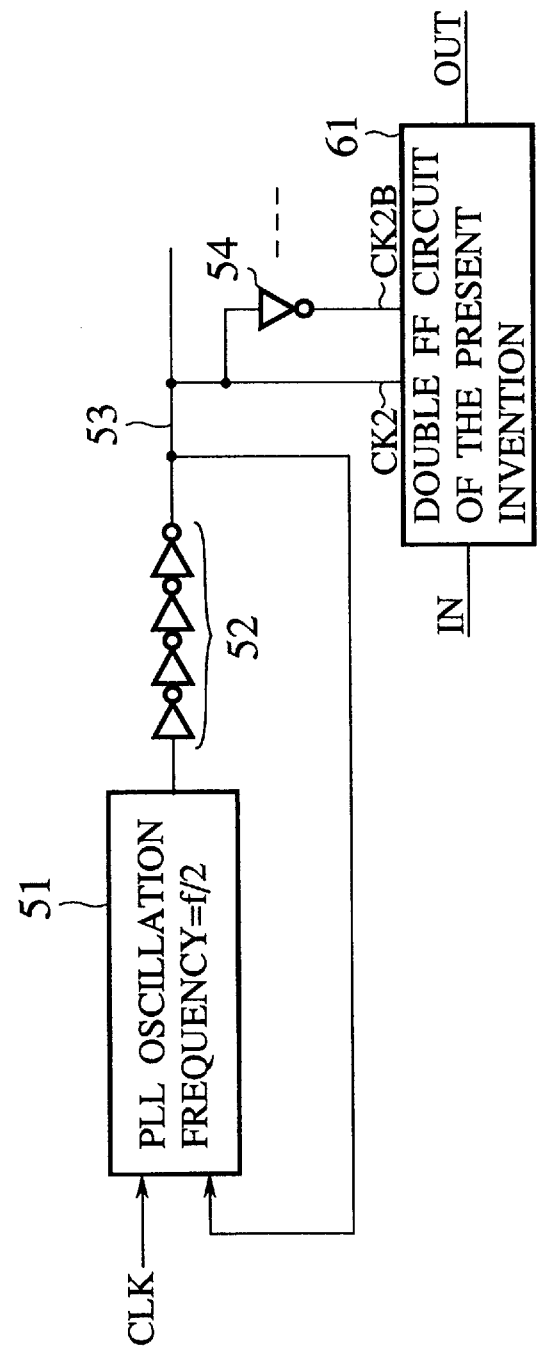
FIG. 10 is a schematic circuit diagram showing a configuration of a clock tree portion for driving the double FF circuit shown in FIG. 8.

FIG. 10 is a schematic circuit diagram showing a configuration of a clock tree portion for driving the double FF circuit shown in FIG. 8.

Figure 3:
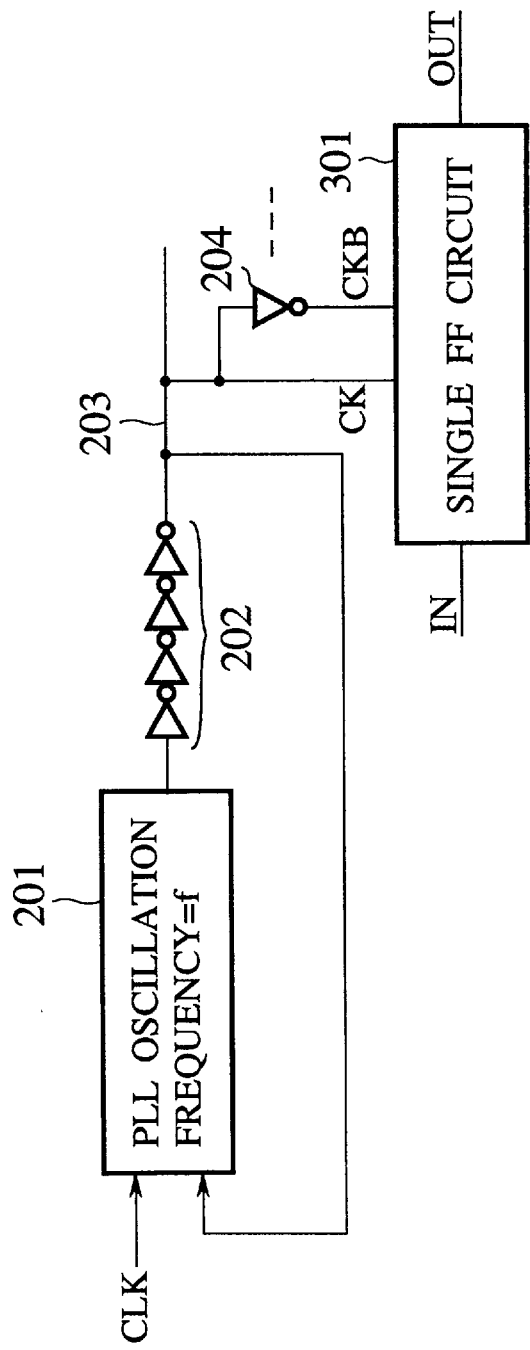
FIG. 3 is a schematic circuit diagram showing a configuration of a clock tree portion for driving the single FF circuit shown in FIG. 1.
Figure 6:
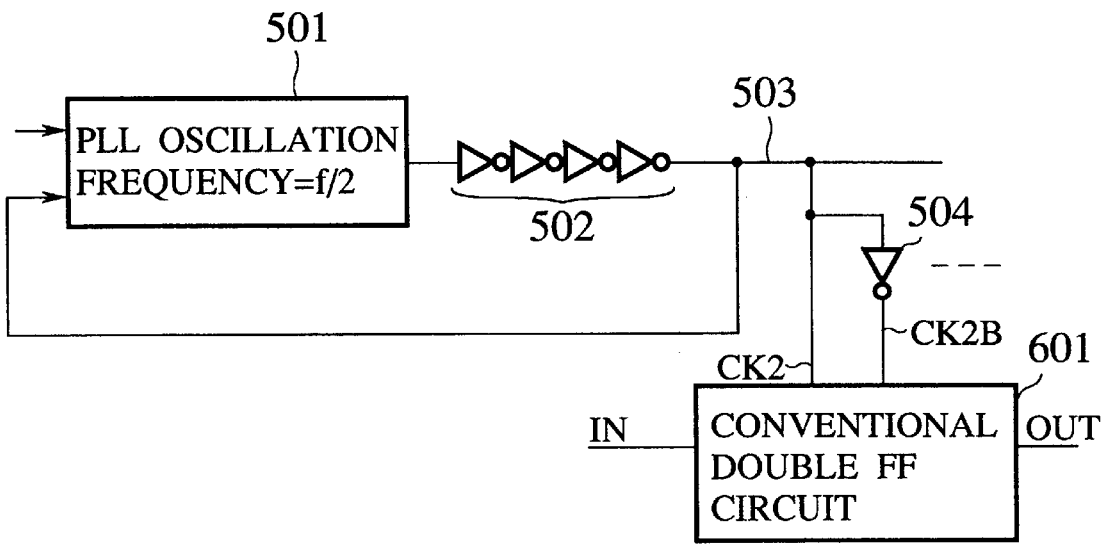
FIG. 6 is a schematic circuit diagram showing a configuration of a clock tree portion for driving the double FF circuit shown in FIG. 4.
Figure 7:
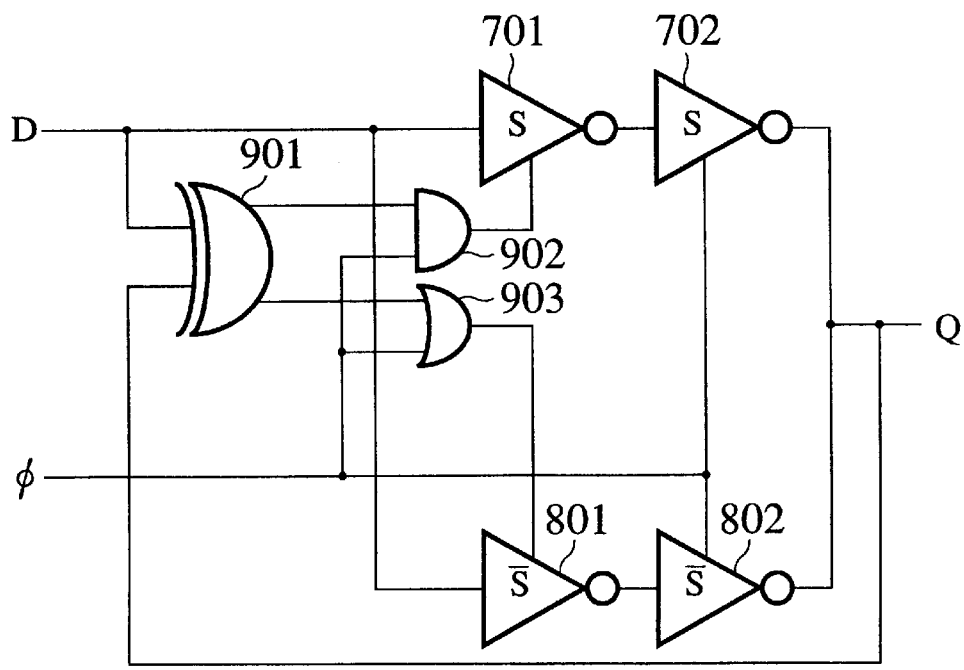
FIG. 7 is a circuit diagram showing another double FF circuit in the prior art.

An overall configuration of the clock tree portion is similar to that of the clock tree portion in the prior art. However, an oscillation frequency of the internal clock CK2 generated in a PLL circuit 51 can be set identically to that in the configuration shown in FIG. 6 (i.e., the oscillation frequency can be reduced to ½ of the oscillation frequency f which is applied to the configuration shown in FIG. 3 in the prior art). In addition, a size of a clock buffer circuit 52 can be reduced to ½ of the configuration shown in FIG. 6 in the prior art.

The internal clock CK2 output from the clock buffer circuit 52 is supplied to the double FF circuit 61 via a signal line 53 and simultaneously the inverted signal CK2B of the internal clock CK2 is supplied to the double FF circuit 61 via an inverter 54.

An operation of the double FF circuit according to the first embodiment of the present invention will be explained hereunder.

In the first embodiment of the present invention, the EX-NOR circuits 31, 33 are employed as comparators for comparing data, the transfer gate 23 which is provided on the output stage of the slave portion 20 is opened and closed according to EX-NOR of the input data IN and the data MIN held in the master portion 10, and the transfer gate 13 which is provided on the output stage of the master portion 10 is opened and closed according to EX-NOR of the input data IN and the data SIN held in the slave portion 20. According to this way, the clocks which are input into the transfer gates 405, 408 provided on the output stages in FIG. 4 in the prior art can be neglected, and the load imposed to the clock nodes can be maintained to be equal to the single FF circuit shown in FIG. 1 in the prior art.

A detailed operation of the double FF circuit according to the first embodiment of the present invention will be explained with reference to a timing chart in FIG. 11.

Figure 1:
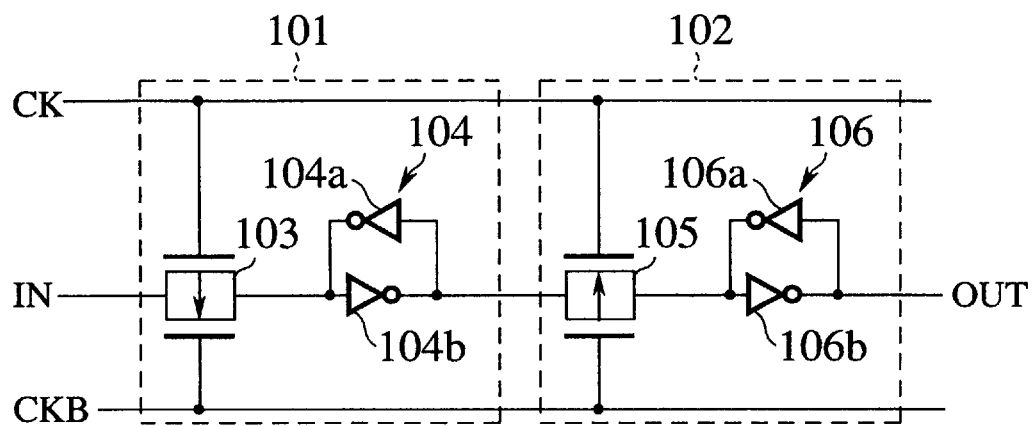
FIG. 1 is a circuit diagram showing a single FF circuit in the prior art.
Figure 2:
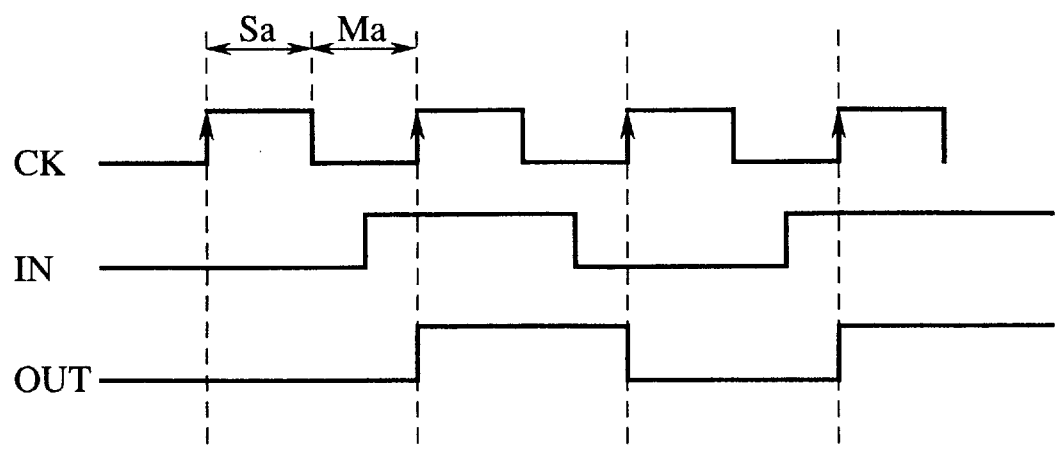
FIG. 2 is a timing chart illustrating an operation of the single FF circuit shown in FIG. 1.
Figure 11:
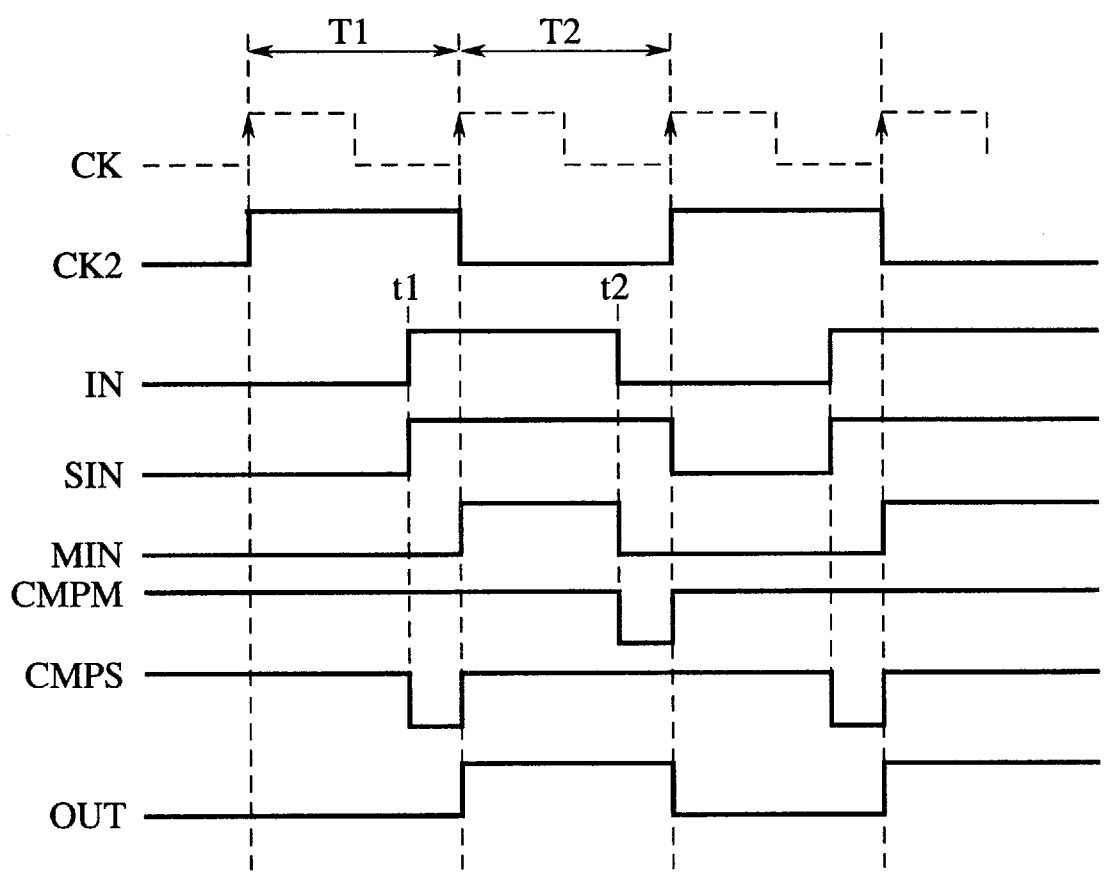
FIG. 11 is a timing chart illustrating an operation of the double FF circuit according to the first embodiment of the present invention.

The waveform of the clock CK illustrated by a broken line in FIG. 11 is depicted to represent that the clock CK2 employed in the first embodiment has a ½ frequency of the clock employed in the single FF circuit shown in FIG. 1.

In the "H" level period T1 of the clock CK2, the input transfer gate 11 of the master portion 10 is turned OFF and the input transfer gate 21 of the slave portion 20 is turned ON. As a result, the data SIN held in the slave portion 20 is shifted to the logical level identical to the present input data IN and the data MIN held in the master portion 10 can be maintained at the logical level of the preceding input data IN.

Accordingly, the output CMPM of the EX-NOR circuit 31 which calculates exclusive NOR of the held data SIN and the input data IN can also be maintained at the same logical level in the period T1. In contrast, since the held data MIN is not varied correspondingly when the logical level of the input data IN is varied, the output CMPS of the EX-NOR circuit 33 which calculates exclusive NOR of the held data MIN and the input data IN cannot always be maintained at the same logical level in the period T1.

In other words, when the input data IN is shifted from "0" level to "1" level in the period T1 (time t1), the logical level of the data MIN held in the master portion 10 is kept at "0" level, but the logical level of the data SIN held in the slave portion 20 is changed from "0" level to "1" level. As a result, the output CMPM is kept at "1" level while the output CMPS is changed from "1" level to "0" level.

Accordingly, the output transfer gate 13 of the master portion 10 is always in its ON state in the period T1, but the output transfer gate 23 of the slave portion 20 is shifted from its ON state to its OFF state at the time t1. As a result, the output OUT is at "0" level, which is the logical level of the held data MIN and SIN, before the time t1 in the period T1 and is at "0" level, which is the logical level of the held data MIN, after the time t1 in the period T1, whereby the output OUT is kept constant at "0" level throughout the period T1.

Subsequently, in the "L" level period T2 of the clock CK2, the input transfer gate 11 of the master portion 10 is turned ON and the input transfer gate 21 of the slave portion 20 is turned OFF. As a result, the data MIN held in the master portion 10 is shifted to the logical level identical to the present input data IN and the data SIN held in the slave portion 20 can be maintained at the logical level of the preceding input data IN.

Accordingly, the output CMPS of the EX-NOR circuit 33 can also be maintained at the same logical level in the period T2. In contrast, the output CMPM of the EX-NOR circuit 31 cannot always be maintained at the same logical level in the period T2.

In other words, when the input data IN is shifted from "1" level to "0" level in the period T2 (time t2), the logical level of the data SIN held in the slave portion 20 is kept at "1" level, but the logical level of the data MIN held in the master portion 10 is changed from "1" level to "0" level. As a result, the output CMPS is kept at "1" level while the output CMPM is changed from "1" level to "0" level.

Accordingly, the output transfer gate 23 of the slave portion 20 is always in its ON state in the period T2, but the output transfer gate 13 of the master portion 10 is shifted from its ON state to its OFF state at the time t2. As a result, the output OUT is at "1" level, which is the logical level of the held data MIN and SIN, before the time t2 in the period T2 and is at "1" level, which is the logical level of the held data SIN, after the time t2 in the period T2, whereby the output OUT is kept constant at "1" level throughout the period T2.

Similar operations will be repeated in and after a period T2.

In the first embodiment of the present invention, the transfer gates 13, 23 provided on the output stages of the latches 12, 22 in the master and slave portions 10, 20 are not driven by the clock unlike the double FF circuit in the prior art shown in FIG. 4, but driven by the input data IN to the double FF circuit and the data held in the double FF circuit. This leads to reduction in gate capacitance load connected to the clock nodes.

In other words, the result of coincidence comparison between the logical value input into the double FF circuit and the logical value held in the latch 22 of the slave portion 20 is used as the signal which turns the transfer gate 13 provided on the output stage of the latch 12 in the master portion 20 into its "transfer state". Similarly, the result of coincidence comparison between the logical value input into the double FF circuit and the logical value held in the latch 12 of the master portion 10 is used as the signal which turns the transfer gate 23 provided on the output stage of the latch 22 in the slave portion 20 into its "transfer state".

Consequently, in the first embodiment, as in the double FF circuit in the prior art, data can be latched when the double FF circuit is triggered by both the leading/trailing edges of the clock, and the magnitude of the gate capacitance load connected to the clock nodes can be suppressed to the same level as the single FF circuit, so that power consumption in the clock tree portion can be reduced to half as compared with the case where the single FF circuit is employed.

This respect will be explained in detail hereunder.

In order to distribute the clock signals, in which "rounding" of the waveform is reduced smaller and clock skew between respective local clock nodes is reduced smaller, in a high speed large-scale LSI, parasitic inductance, parasitic capacitance, and parasitic resistance to cause "rounding" of the waveform must be evaluated with good precision and then the great care must be taken to physical placement of the clock tree and a size design of the clock buffer. Especially, since the influence of parasitic inductance component is increased in proportion to the frequency of transfer signal, such influence becomes more remarkable as the frequency of the distributed clock becomes higher.

In order to overcome this problem, to reduce the frequency of supplied clock to ½ in the double FF circuit means that equivalent function in circuit operation can be achieved by making use of the quite same clock tree structure as the logical circuit employing the single FF circuit and that the influence of parasitic inductance component upon "rounding" of the waveform of the clock and skew between the clocks can be reduced to ½. However, as described in detail hereunder, the double FF circuit in the prior art has involved a drawback in power consumption in the clock tree portion.

Most of power consumption in the common CMOS logical circuit is generated at the time when the logical gates are charged and discharged. Assume that, when a certain logical gate operated by the voltage $V_{DD}$ drives a load capacitance $C_L$, the clock frequency is $f_{CLK}$ and the switching probability is p, power consumption $P_{charge}$ caused by charge and discharge can be expressed by $$P_{charge} = p \cdot f_{CLK} \cdot C_L \cdot V_{DD}^2 \qquad (1)$$

As evident from Eq. (1), power consumption is proportional to the clock frequency and the load capacitance. If it is assumed that power consumption in the single FF circuit in the prior art shown in FIG. 1 can be expressed by Eq. (1), the clock frequency $f_{CLK}$ can be reduced to half in the double FF circuit in the prior art shown in FIG. 4, nevertheless the load capacitance $C_L$ increases a little less than twice (strictly speaking, it does not become twice since actually the wiring capacitance component is also included in the load capacitance $C_L$). Therefore, power consumption can be hardly reduced.

On the contrary, in the first embodiment of the present invention shown in FIG. 8, since the transfer gates provided on the output stage of both latches are not driven by the clock signal but the data signals, i.e., input data to the latches, the clock frequency $f_{CLK}$ can be reduced to ½ while keeping the load capacitance $C_L$ equal to that in the single FF circuit. Therefore, power consumption can be reduced to ½.

Accordingly, in the first embodiment of the present invention, with the use of the same clock tree structure used for the single FF circuit, the influence of "rounding" of the waveform of the clock and skew between the clocks, when distributed, can be reduced and at the same time power consumption in the clock tree portion can be reduced.

Figure 12:
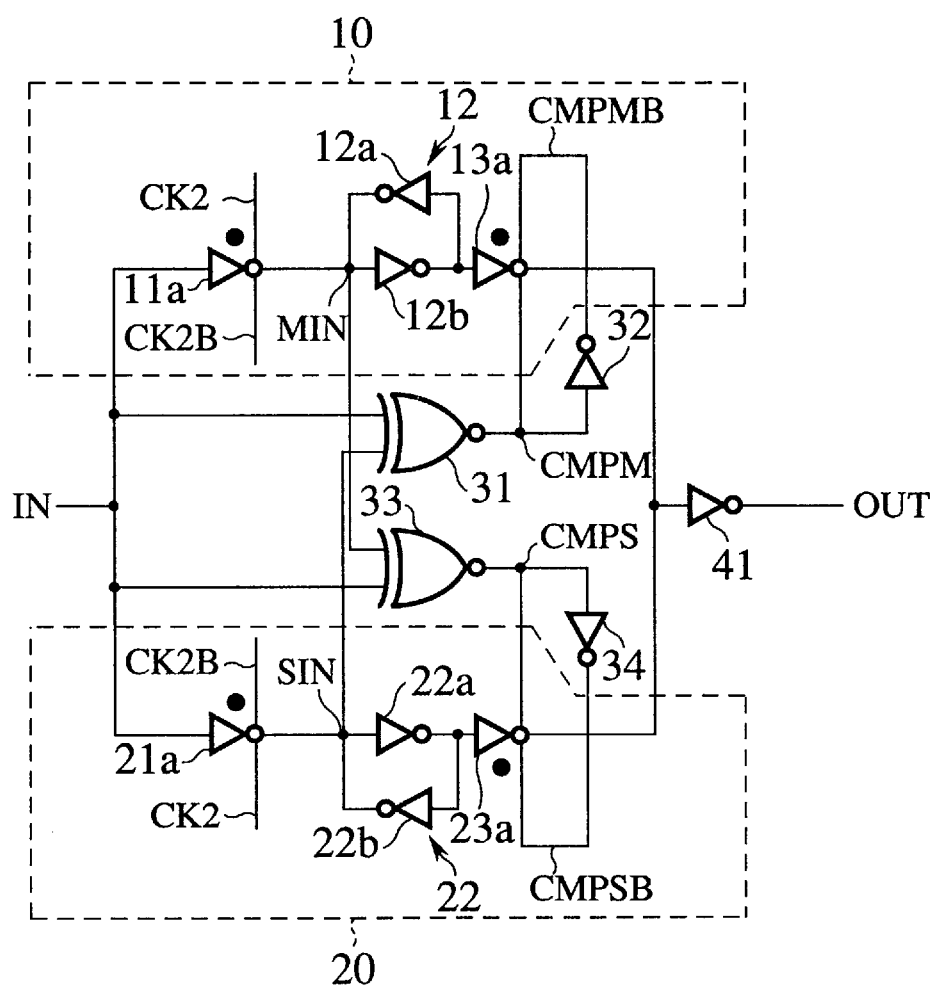
FIG. 12 is a circuit diagram showing a double FF circuit as a logic storing circuit according to a second embodiment of the present invention.

FIG. 12 is a circuit diagram showing a double FF circuit as a logic storing circuit according to a second embodiment of the present invention. In FIG. 12, like references designate like parts and elements in FIG. 8 and their description will be omitted.

In the double FF circuit according to the second embodiment of the present invention, the transfer gates 11, 13, 21, 23 provided on the input and output stages of the double FF circuit in FIG. 8 (the first embodiment) are replaced with tri-state buffers 11a, 13a, 21a, 23a respectively.

Figure 13:
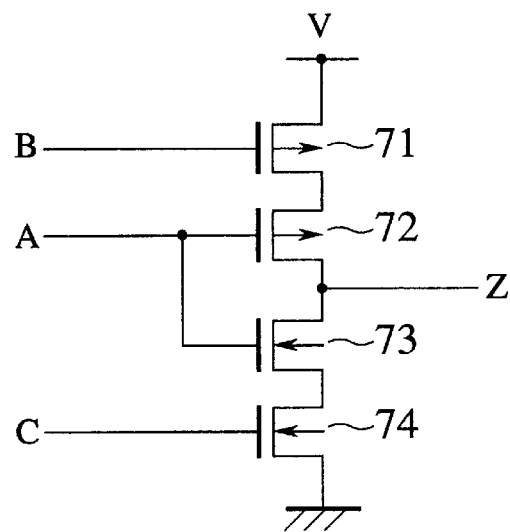
FIG. 13 is a circuit diagram showing a configuration of a tri-state buffer used in the double FF circuit as the logic storing circuit according to the second embodiment of the present invention.

As shown in FIG. 13, for example, these tri-state buffers are constructed by connecting P-MOSs 71, 72 and N-MOSs 73, 74 in series between the power supply $V_{DD}$ and the ground GND. Input data A is supplied to gates of the P-MOS 72 and N-MOS 73, a control signal B is supplied to a gate of the P-MOS 71, and a control signal C is supplied to a gate of the N-MOS 74. An output data Z is output from anode between respective drains of the P-MOS 72 and the N-MOS 73.

In the tri-state buffers 11a and 21a in FIG. 12, the "control signal B" represents the clock CK2 and the inverted clock signal CK2B respectively, and the "control signal C" represents the inverted clock CK2B and the clock CK2 respectively. In addition, in the tri-state buffers 13a and 23a in FIG. 12, the "control signal B" represents the CMPMB signal and the CMPSB signal respectively, and the "control signal C" represents the CMPM signal and the CMPS signal respectively.

According to the tri-state buffer, inverted data of the input data A is output as the output data Z when the control signal B is at "L" level and the control signal C is at "H" level. Conversely, the output terminal of the tri-state buffer, from which the output data Z is output, is turned to its high impedance state when the control signal B is at "H" level and the control signal C is at "L" level.

The double FF circuit of the second embodiment can carry out similar operations to the first embodiment by making use of action of such tri-state buffers.

Figure 14:
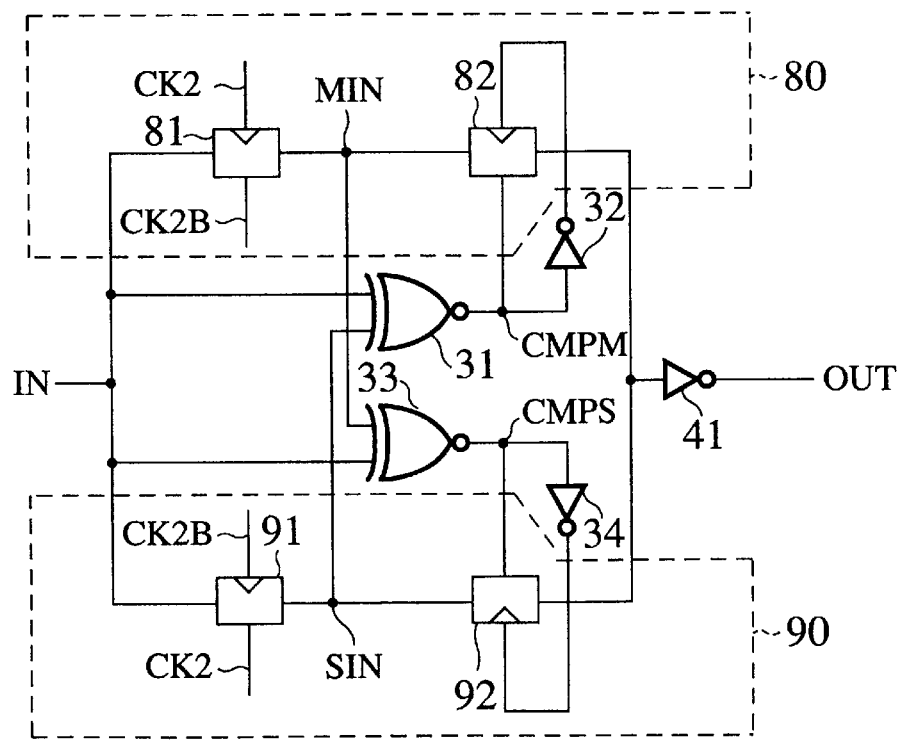
FIG. 14 is a circuit diagram showing a double FF circuit as a logic storing circuit according to a third embodiment of the present invention.

FIG. 14 is a circuit diagram showing a double FF circuit as a logic storing circuit according to a third embodiment of the present invention. In FIG. 14, like references designate like parts and elements in FIG. 8 and their description will be omitted.

The third embodiment of the present invention illustrates an example of a double FF circuit constructed by using dynamic latches. A master portion 80 and a slave portion 90 are constructed by serially connecting respectively dynamic latch means 81 and 82 and dynamic latch means 91 and 92, all being made of transfer gates, for example.

According to this configuration, the master portion 80 and the slave portion 90 can hold input data IN dynamically in the form of charges accumulated on respective nodes between the dynamic latch means 81 and 82 and between the dynamic latch means 91 and 92.

The double FF circuit of the third embodiment can carry out similar operations to those in the first embodiment by making use of actions of such dynamic latches, and therefore it can attain similar advantages to those of the first embodiment.

As explained in detailed above, according to the logic storing circuit of the present invention, since a present logic value of the input data is compared with a logic value in a preceding half period of the clock to determine a coincidence therebetween and then output states of the data held in the master portion 10 and the slave portion 20 are controlled based on the result of its comparison, data can be latched to synchronize with both the leading/trailing edges of the clock, like the double FF circuit in the prior art, and the magnitude of gate capacitance load connected to the clock nodes can be suppressed to the same extent as the single FF circuit, so that power consumption in the clock tree portion can be reduced to half as compared with the case where the single FF circuit is employed.

In more detail, since the exclusive NOR circuit 31, which compares the data SIN held in the latch 22 with the input data IN to determine a coincidence between them and then controls the output state of the output transfer gate 13 on the basis of the result of such comparison, and the exclusive NOR circuit 33, which compares the data MIN held in the latch 12 with the input data IN to determine a coincidence between them and then controls the output state of the output transfer gate 23 on the basis of the result of such comparison, are provided to the double FF circuit, the above advantages can be obtained. In addition, if the transfer gates are employed in this manner, it is feasible to simplify the circuit configuration.

Even if the tri-state buffers are employed instead of the transfer gates, exact operations are made possible with the use of simplified configuration.

Also, the input data IN can be held dynamically in the form of charges accumulated on the nodes between the dynamic latch means 81 and 82 and between the dynamic latch means 91 and 92 respectively.

If the logic circuit which is equipped, together with the logic circuit, with the clock supplying means for supplying the clock to the logic storing circuit is constructed, similar advantages to those obtained by the logic storing circuit can be attained and in addition the magnitude of gate capacitance load connected to the clock supplying means can be suppressed to the same level as the single FF circuit, and thus power consumption in the clock supplying means can be reduced to half as compared with the case where the single FF circuit is employed.

It should be understood that many modifications and adaptations of the invention will become apparent to those skilled in the art and it is intended to encompass such obvious modifications and changes in the scope of the claims appended hereto.

What is claimed is:

1. A logic storing circuit comprising:
   first data holding means for introducing input data thereinto in a low level period of a clock, and holding and outputting the input data therefrom in a high level period of the clock;
   second data holding means for introducing the input data thereinto in the high level period of the clock, and holding and outputting the input data therefrom in the low level period of the clock; and
   a comparing/controlling section for comparing a present logic value of the input data with a logic value of the input data in a preceding half period of the clock to determine a coincidence therebetween, and then controlling output states of the input data held in the first data holding means and the second data holding means based on a result of the comparison.

2. A logic storing circuit comprising:
   first data introducing means for introducing input data thereinto in a low level period of a clock;
   first latch means for holding data output from the first data introducing means;

first data outputting means for outputting data held in the first latch means to a location external to said logic storing circuit in a high level period of the clock;

second data introducing means for introducing the input data thereinto in the high level period of the clock;

second latch means for holding data output from the second data introducing means;

second data outputting means for outputting data held in the second latch means to the location external to said logic storing circuit in the low level period of the clock;

a first comparing/controlling section for comparing the data held in the second latch means with the input data to determine a coincidence therebetween, and then controlling output states of the first data outputting means based on a result of the comparison preformed by said first comparing/controlling section; and a second comparing/controlling section for comparing the data held in the first latch means with the input data to determine a coincidence therebetween, and then controlling output states of the second data outputting means based on a result of the comparison preformed by said second comparing/controlling section.

3. A logic storing circuit according to claim 2, wherein any or all of the first data introducing means, the second data introducing means, the first data outputting means, and the second data outputting means include of a transfer gate.

4. A logic storing circuit according to claim 2, wherein any or all of the first data introducing means, the second data introducing means, the first data outputting means, and the second data outputting means include of a tri-state buffer.

5. A logic storing circuit comprising:

first data introducing means for introducing input data thereinto in a low level period of a clock;

first data outputting means for outputting data introduced in the first data introducing means to a location external to said logic storing circuit in a high level period of the clock;

second data introducing means for introducing the input data thereinto in the high level period of the clock;

second data outputting means for outputting data introduced in the second data introducing means to the location external to said logic storing circuit in the low level period of the clock;

a first comparing/controlling section for comparing the data held in the second data introducing means with the input data to determine a coincidence therebetween, and then controlling output states of the first data outputting means based on a result of the comparison preformed by said first comparing controlling section; and a second comparing/controlling section for comparing the data held in the first data introducing means at a certain time point with the input data to determine a coincidence therebetween, and then controlling output states of the second data outputting means based on a result of the comparison preformed by said second comparing/controlling section.

6. A logic circuit comprising:

a logic storing circuit including first data holding means for introducing input data thereinto in a low level period of a clock, and holding and outputting the input data therefrom in a high level period of the clock, second data holding means for introducing the input data thereinto in the high level period of the clock, and holding and outputting the input data therefrom in the low level period of the clock, and a comparing/controlling section for comparing a present logic value of the input data with preceding logic values of the input data to determine a coincidence therebetween, and then controlling output states of the input data held in the first data holding means and the second data holding means based on a result of the comparison; and clock supplying means for supplying the clock to the logic storing circuit.

* * * * *